United States Patent
Sugisawa

(10) Patent No.: US 10,411,696 B2
(45) Date of Patent: Sep. 10, 2019

(54) POWER SUPPLY CONTROL DEVICE

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Yuuki Sugisawa, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/090,427

(22) PCT Filed: Mar. 22, 2017

(86) PCT No.: PCT/JP2017/011413
§ 371 (c)(1),
(2) Date: Oct. 1, 2018

(87) PCT Pub. No.: WO2017/175584
PCT Pub. Date: Oct. 12, 2017

(65) Prior Publication Data
US 2019/0123739 A1 Apr. 25, 2019

(30) Foreign Application Priority Data

Apr. 5, 2016 (JP) ................. 2016-075885

(51) Int. Cl.
*H03K 17/56* (2006.01)
*H03K 17/687* (2006.01)
(Continued)

(52) U.S. Cl.
CPC ............. *H03K 17/687* (2013.01); *H02J 1/00* (2013.01); *H02J 1/102* (2013.01); *H02J 7/00* (2013.01);
(Continued)

(58) Field of Classification Search
None
See application file for complete search history.

(56) References Cited

U.S. PATENT DOCUMENTS 10,069,439 B2 * 9/2018 Yokoi ................. H02M 7/5387
2010/0103576 A1 4/2010 Sugimoto et al.
(Continued)

FOREIGN PATENT DOCUMENTS

JP 2002-528938 A 9/2002
JP 2014-072596 A 4/2014
(Continued)

OTHER PUBLICATIONS

Jun. 13, 2017 International Search Report issued in International Patent Application No. PCT/JP2017/011413.

*Primary Examiner* — Lincoln D Donovan
*Assistant Examiner* — Khareem E Almo
(74) *Attorney, Agent, or Firm* — Oliff PLC

(57) ABSTRACT

A power supply control device includes a first semiconductor switch and a second semiconductor switch, which are switched on if the voltage at the gate is at least an ON-threshold, and they are switched off if the voltage at the gate is less than an OFF-threshold. A resistor is connected between the source and the gate of the first semiconductor switch. A diode is connected between gates of the first semiconductor switch and the second semiconductor switch. A driving unit adjusts the voltage at the gate of the second semiconductor switch, switches on and off the first semiconductor switch and the second semiconductor switch, and (Continued)

controls the supply of power via the second semiconductor switch.

6 Claims, 8 Drawing Sheets

(51) Int. Cl.
 *H02J 1/00* (2006.01)
 *H02J 7/00* (2006.01)
 *H02J 1/10* (2006.01)
 *H02M 3/155* (2006.01)
 *H03K 17/082* (2006.01)
 *H03K 17/16* (2006.01)

(52) U.S. Cl.
 CPC ........... *H02J 7/0009* (2013.01); *H02M 3/155* (2013.01); *H03K 17/0822* (2013.01); *H03K 17/161* (2013.01)

(56) References Cited

U.S. PATENT DOCUMENTS

| | | | |
|---|---|---|---|
| 2017/0179849 A1* | 6/2017 | Yokoi | H03K 17/0828 |
| 2017/0201204 A1* | 7/2017 | Kawano | H02P 6/16 |
| 2018/0013415 A1* | 1/2018 | Ikeda | H03K 17/74 |
| 2018/0183317 A1* | 6/2018 | Nakahara | H02M 3/155 |
| 2018/0287484 A1* | 10/2018 | Braginsky | H02M 7/44 |
| 2018/0375457 A1* | 12/2018 | Kitamura | H02P 25/18 |
| 2019/0123739 A1* | 4/2019 | Sugisawa | H02J 1/00 |

FOREIGN PATENT DOCUMENTS

| | | |
|---|---|---|
| JP | 5772776 B2 | 9/2015 |
| WO | 2008/108330 A1 | 9/2008 |

\* cited by examiner

POWER SUPPLY CONTROL DEVICE

TECHNICAL FIELD

The present disclosure relates to a power supply control device configured to control the supply of power via a switch.

BACKGROUND ART

An example of a power supply control device configured to control the supply of power from a battery of a vehicle to a load is a power supply control device in which the drain and the source of an N-channel FET (Field Effect Transistor) are respectively connected to a positive electrode of the battery and one end of the load, and a negative electrode of the battery is connected to the other end of the load. The FET functions as a semiconductor switch in this power supply control device. The FET is switched on by increasing the voltage at the gate to at least an ON-threshold, and is switched off by reducing the voltage at the gate to less than an OFF-threshold. If the FET is on, power is supplied from the battery to the load, and if the FET is off, power is supplied from the battery to the load.

However, a parasitic diode is formed between the drain and the source of the FET. The cathode and the anode of the parasitic diode are respectively connected to the drain and the source of the N-channel FET. Thus, if the positive electrode and the negative electrode of the battery are incorrectly connected to the other end of the load and the drain of the FET, even if the FET is off, current continuously flows from the other end of the load to one end, and there is a concern that the load will operate incorrectly.

Patent Document 1 discloses a power supply control device capable of preventing current from flowing to a load if its battery is connected incorrectly. The power supply control device disclosed in Patent Document 1 includes two N-channel FETs (Field Effect Transistors), and the drain of one of the FETs is connected to the drain of the other FET. A positive electrode of the battery is connected to the source of one of the FETs, and one end of the load is connected to the source of the other FET. A negative electrode of the battery is connected to the other end of the load. The supply of power from the battery to the load is controlled by switching on and off the two FETs together.

The cathode of the parasitic diode provided in one of the FETs is connected to the cathode of the parasitic diode provided in the other FET. Thus, if the two FETs are off, no current flows from the battery to the load irrespective of the battery connection state.

CITATION LIST

Patent Documents

Patent Document 1: Japanese Patent 5772776

SUMMARY

Technical Problem

As disclosed in Patent Document 1, a power supply control device configured to switch on and off two FETs by one drive circuit is conceivable as a power supply control device including two N-channel FETs. In such a power supply control device, the gates of the two FETs are directly connected to an output terminal of the drive circuit, for example. The drive circuit increases the voltage output from the output terminal, and thereby increases the voltages at the gates of the two FETs from zero V, and switches on the two FETs. Also, the drive circuit reduces the voltage output from the output terminal, and thereby reduces the voltages at the gates of the two FETs to zero V, and switches off the two FETs.

As described above, the power supply control device in which the output terminal of the drive circuit is directly connected to the gates of the two FETs has one drive circuit, and thus is manufactured at a low cost. However, the two FETs should be switched on and off using one drive circuit in this power supply control device, and thus it takes a long time to switch on and off each FET, and such a power supply control device is problematic in that it has a large switching loss.

Aspects of the present disclosure were achieved in light of the foregoing circumstances, and an object of certain disclosed preferred embodiments is to provide an inexpensive power supply control device with a small switching loss.

Solution to Problem

A power supply control device according to a preferred embodiment is a power supply control device including a switching unit configured to switch on and off a first semiconductor switch and a second semiconductor switch whose current input terminal is connected to a current output terminal of the first semiconductor switch, the power supply control device being configured to control supply of power via the second semiconductor switch by switching with the switching unit, in which the first semiconductor switch and the second semiconductor switch are switched on if a voltage at a control terminal is at least an ON-threshold, and the first semiconductor switch and the second semiconductor switch are switched off if the voltage at the control terminal is less than an OFF-threshold, the power supply control device including a resistor that is connected between a current input terminal and the control terminal of the first semiconductor switch; and a diode whose cathode is connected to the control terminal of the first semiconductor switch and whose anode is connected to the control terminal of the second semiconductor switch, the switching unit performing switching by adjusting the voltage at the control terminal of the second semiconductor switch.

According to a preferred embodiment, the current output terminal of the first semiconductor switch is connected to the current input terminal of the second semiconductor switch, and the resistor is connected between the current input terminal and the control terminal of the first semiconductor switch. The cathode and the anode of the diode are connected to the control terminals of the first semiconductor switch and the second semiconductor switch. For example, the positive electrode of the battery is connected to the current input terminal of the first semiconductor switch, one end of the load is connected the current output terminal of the second semiconductor switch, and the negative electrode of the battery is connected to the other end of the load.

If the voltage at the control terminal of the second semiconductor switch is less than a voltage output from the battery, then no current flows from the positive electrode of the battery via the resistor, and the voltage at the control terminal of the first semiconductor switch is maintained at the voltage output from the battery. The switching unit switches on the first semiconductor switch and the second semiconductor switch, and thus supplies current to parasitic capacitances that are connected to the control terminals of the first semiconductor switch and the second semiconductor switch, and increases the voltage at the control terminal of the second semiconductor switch.

In this process, while the voltage at the control terminal of the second semiconductor switch is less than a voltage output from the battery, the switching unit supplies current only to the parasitic capacitance that is connected to the control terminal of the second semiconductor switch, and increases the voltage at the control terminal of the second semiconductor switch. Furthermore, if the voltage at the control terminal of the second semiconductor switch is at least the voltage output from the battery, the switching unit supplies current to the parasitic capacitances that are connected to the control terminals of the first semiconductor switch and the second semiconductor switch, and increases the voltage at the control terminals of the first semiconductor switch and the second semiconductor switch. This switches on the first semiconductor switch and the second semiconductor switch. Because the voltage at the control terminal of the first semiconductor switch is maintained at the voltage output from the battery in advance, the first semiconductor switch and the second semiconductor switch are switched on in a short time period, and have a small switching loss.

For example, by connecting the control terminal of the second semiconductor switch to the negative electrode of the battery via an internal resistance, the switching unit causes the parasitic capacitances connected to the control terminals of the second semiconductor switches to discharge, reduces the voltage at the control terminals of the second semiconductor switches, and switches off the second semiconductor switches. If the control terminal of the second semiconductor switch is connected to the negative electrode of the battery, the parasitic capacitance connected to the control terminal of the first semiconductor switch discharges via the resistor, the voltage at the control terminal of the first semiconductor switch decreases, and the first semiconductor switch is switched off. Because the parasitic capacitance connected to the control terminal of the first semiconductor switch discharges via the resistor, the switching unit should cause only the parasitic capacitance connected to the control terminal of the second semiconductor switch to discharge. Thus, the first semiconductor switch and the second semiconductor switch are switched off in a short time period, and have a small switching loss.

Also, the first semiconductor switch and the second semiconductor switch are switched on and off by adjusting the voltage at the control terminal of the second semiconductor switch, and thus are manufactured at a low cost.

The power supply control device according to a preferred embodiment includes a parasitic diode whose cathode and anode are connected to the current output terminal and the current input terminal of the first semiconductor switch, and a capacitor that is connected between the control terminal of the first semiconductor switch and the current output terminal of the second semiconductor switch.

According to a preferred embodiment, if the positive electrode of the battery is connected to the current input terminal of the first semiconductor switch, one end of the load is connected to the current output terminal of the second semiconductor switch, and the negative electrode of the battery is connected to the other end of the load, when the first semiconductor switch and the second semiconductor switch are off, the capacitor is charged by the battery. If the switching unit increases the voltage at the control terminal of the second semiconductor switch, current flowing to the load via the second semiconductor switch increases, and the voltage at the current output terminal of the second semiconductor switch also increases. Accordingly, even if the voltage at the control terminal of the second semiconductor switch is less than the voltage output from the battery, the voltage at one end of the capacitor on the battery side exceeds the voltage output from the battery, and the parasitic capacitance connected to the control terminal of the first semiconductor switch is charged. As a result, the first semiconductor switch is switched on more quickly.

In the power supply control device according to a preferred embodiment, the number of second semiconductor switches and the number of diodes are each at least two and are the same, the current input terminals of a plurality of the second semiconductor switches are connected to the current output terminal of the first semiconductor switch, cathodes of a plurality of the diodes are connected to the control terminal of the first semiconductor switch, anodes of the plurality of diodes are respectively connected to the control terminals of the plurality of second semiconductor switches, and the switching unit individually adjusts voltages at the control terminals of the plurality of second semiconductor switches.

According to a preferred embodiment, the current input terminals of the plurality of second semiconductor switches are connected to the current output terminal of the first semiconductor switch. The cathodes of the plurality of diodes are connected to the control terminal of the first semiconductor switch, and the anodes of the plurality of diodes are respectively connected to the control terminals of the plurality of second semiconductor switches. If the switching unit increases the voltage at at least one of the control terminals of the plurality of second semiconductor switches, the first semiconductor switch, the one second semiconductor switch in which the voltage is increased at the control terminal, or one or more second semiconductor switches that correspond to the plurality of control terminals are switched on. The supply of power via the plurality of second semiconductor switches is controlled by individually switching on and off the plurality of second semiconductor switches.

The power supply control device according to a preferred embodiment includes a parasitic diode whose cathode and anode are connected to the current output terminal and the current input terminal of the first semiconductor switch, a plurality of second diodes whose cathodes are connected to the control terminal of the first semiconductor switch, a plurality of third diodes whose cathodes are respectively connected to anodes of the plurality of second diodes and whose anodes are connected to the current output terminal of the first semiconductor switch, and a plurality of capacitors that each have one end connected to the anodes of the plurality of second diodes, in which the number of second diodes, the number of third diodes, and the number of capacitors are the same as the number of second semiconductor switches, and other ends of the plurality of capacitors are respectively connected to the current output terminals of the plurality of second semiconductor switches.

According to a preferred embodiment, if the positive electrode of the battery is connected to the current input terminal of the first semiconductor switch, one end of the load is connected to the current output terminals of the second semiconductor switches, and the negative electrode of the battery is connected to the other end of the load, when the first semiconductor switch and the second semiconductor switches are off, the plurality of capacitors are respectively charged via the third diodes. If the switching unit increases the voltage at the control terminal of one second semiconductor switch in a state in which the first semiconductor switch and the second semiconductor switches are off, the voltage at the current output terminal of the one second semiconductor switch increases. Accordingly, even if the voltage at the control terminal of the one second semiconductor switch is less than the voltage output from the battery, the voltage at one end on the battery side of a capacitor whose one end is connected to the current output terminal of the one second semiconductor switch exceeds the voltage output from the battery, and the parasitic capacitance connected to the control terminal of the first semiconductor switch is charged via the second diode. Accordingly, the first semiconductor switch is switched on more quickly.

In the power supply control device according to a preferred embodiment, the first semiconductor switch is switched on and off based on the voltage at the control terminal with respect to a potential of the current input terminal, and the second semiconductor switch is switched on and off based on the voltage at the control terminal with respect to a potential of the current output terminal.

According to a preferred embodiment, the first semiconductor switch and the second semiconductor switches are N-channel FETs, for example, and the drain of the first semiconductor switch is connected to the drains of the second semiconductor switches.

The power supply control device according to a preferred embodiment includes a switch that is connected between the current input terminal and the control terminal of the first semiconductor switch and that is switched on if a negative voltage is applied to the current input terminal of the first semiconductor switch with respect to the potential of the current output terminal of the plurality of second semiconductor switches, in which the first semiconductor switch is off if a voltage across the current input terminal and the control terminal is approximately zero V.

According to a preferred embodiment, if a negative voltage is applied to the current input terminal of the first semiconductor switch with respect to the potential of the current output terminal of the second semiconductor switch, the switch is switched on, the voltage across the current input terminal and the control terminal of the first semiconductor switch is approximately zero V, and the first semiconductor switch is switched off. Thus, even though the first semiconductor switch and the second semiconductor switches are on, if a negative voltage is applied to the current input terminal of the first semiconductor switch with respect to the potential of the current output terminal of each of the second semiconductor switches, the first semiconductor switch is forcibly switched off. Thus, current is reliably prevented from flowing from the second semiconductor switches to the first semiconductor switch.

Advantageous Effects

According to aspects of certain preferred embodiments, the power supply control device with a switching loss can be manufactured at a low cost.

DESCRIPTION OF EMBODIMENTS

Hereinafter, the present invention will be described in detail with reference to the drawings showing embodiments.

Embodiment 1

Figure 1:
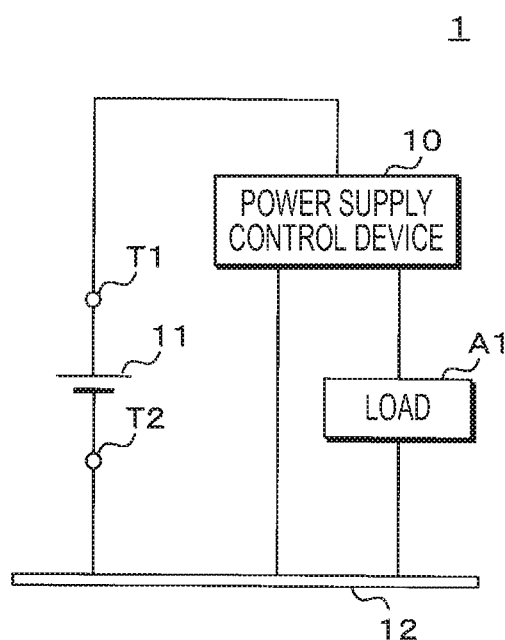
FIG. 1 is a block diagram showing the configuration of the main portions of a power supply system in Embodiment 1.

FIG. 1 is a block diagram showing the configuration of the main portions of a power supply system 1 in Embodiment 1. The power supply system 1 is suitably installed in a vehicle, and includes a power supply control device 10, a battery 11, a conductor 12, and a load A1. The conductor 12 is a body of the vehicle, for example.

The power supply control device 10 is connected separately to the conductor 12, one end of the load A1, and a positive electrode terminal T1. The other end of the load A1 and a negative electrode terminal T2 are also connected to the conductor 12. The battery 11 is detachably connected between the positive electrode terminal T1 and the negative electrode terminal T2. A normal connection state of the battery 11 is a state in which the positive electrode and the negative electrode of the battery 11 are respectively connected to the positive electrode terminal T1 and the negative electrode terminal T2. An incorrect connection state of the battery 11 is a state in which the positive electrode and the negative electrode of the battery 11 are respectively connected to the negative electrode terminal T2 and the positive electrode terminal T1.

If the battery 11 is connected normally, then power is supplied from the battery 11 to the A1 via the power supply control device 10. The power supply control device 10 controls the supply of power from the battery 11 to the load A1. The load A1 is an electric device installed in the vehicle, and when power is supplied to the load, the load operates, and when power supply is stopped, the load stops operating.

If the battery 11 is connected incorrectly, the power supply control device 10 prevents current from flowing from the negative electrode terminal T2 to the load A1.

Figure 2:
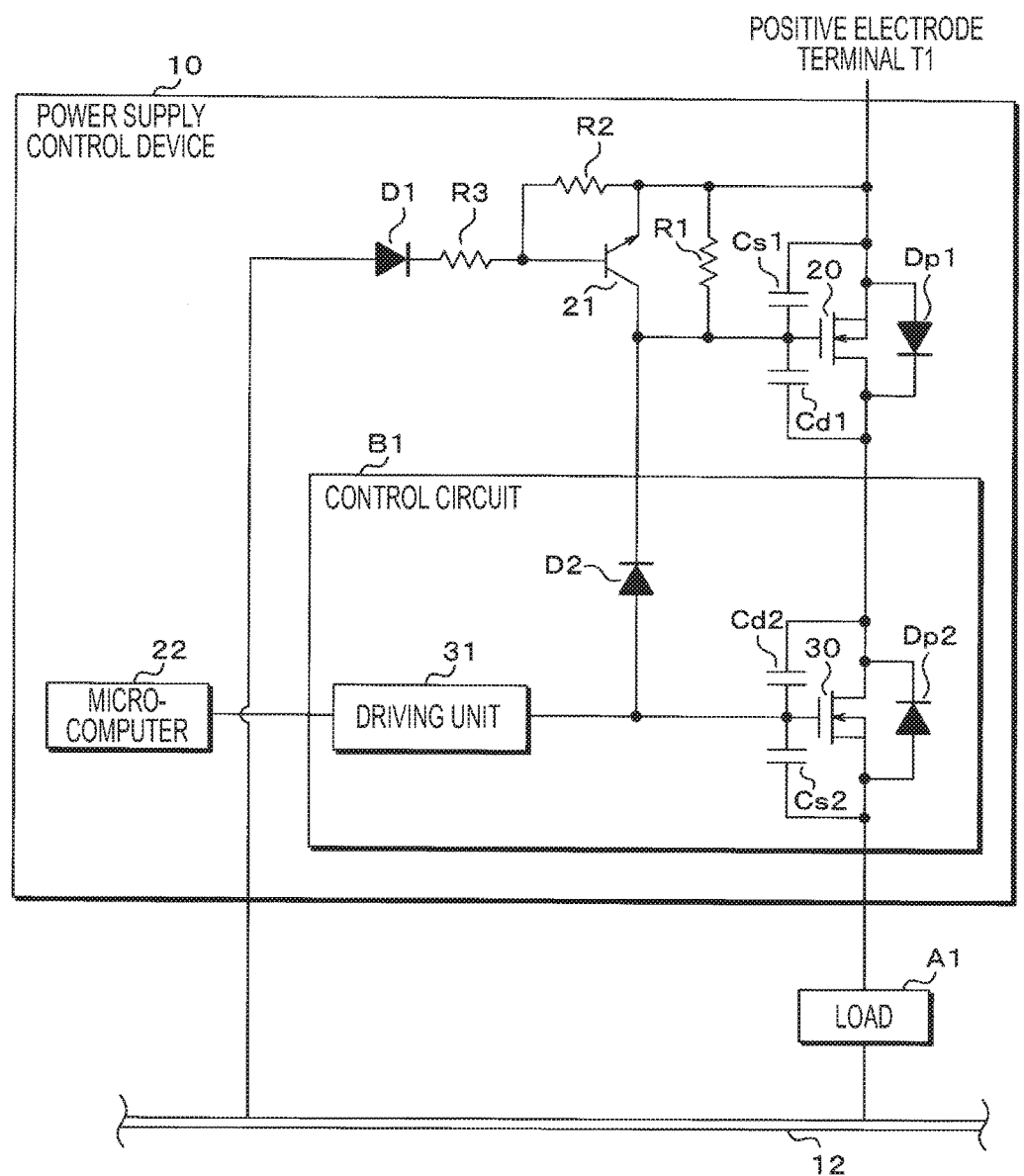
FIG. 2 is a circuit diagram of a power supply control device.

FIG. 2 is a circuit diagram of the power supply control device 10. The power supply control device 10 includes a first semiconductor switch 20, a switch 21, a microcomputer 22, a control circuit B1, a diode D1, and resistors R1, R2, and R3.

The first semiconductor switch 20 is an N-channel FET. Thus, the power supply control device 10 further includes a parasitic diode Dp1 and parasitic capacitances Cs1 and Cd1 that are formed when the first semiconductor switch 20 is manufactured. The parasitic diode Dp1 is connected between the drain and the source of the first semiconductor switch 20, and the cathode and the anode of the parasitic diode Dp1 are respectively connected to the drain and the source of the first semiconductor switch 20. The parasitic capacitance Cs1 is connected between the gate and the source of the first semiconductor switch 20, and the parasitic capacitance Cd1 is connected between the gate and the drain of the first semiconductor switch 20. The switch 21 is an NPN bipolar transistor.

The control circuit B1 includes a second semiconductor switch 30, a driving unit 31, and a diode D2.

The second semiconductor switch 30 is an N-channel FET. Thus, the control circuit B1 further includes a parasitic diode Dp2 and parasitic capacitances Cs2 and Cd2 that are formed when the second semiconductor switch 30 is manufactured. The parasitic diode Dp2 is connected between the drain and the source of the second semiconductor switch 30, and the cathode and the anode of the parasitic diode Dp2 are respectively connected to the drain and the source of the second semiconductor switch 30. The parasitic capacitance Cs2 is connected between the gate and the source of the second semiconductor switch 30, and the parasitic capacitance Cd2 is connected between the gate and the drain of the second semiconductor switch 30.

The source of the first semiconductor switch 20 is connected to the positive electrode terminal T1. The drain of the first semiconductor switch 20 is connected to the drain of the second semiconductor switch 30 of the control circuit B1. The source of the second semiconductor switch 30 is connected to one end of the load A1. The gate of the first semiconductor switch 20 is connected to the cathode of the diode D2 of the control circuit B1. The anode of the diode D2 is connected to the gate of the second semiconductor switch 30. The driving unit 31 is further connected to the gate of the second semiconductor switch 30. The microcomputer 22 is further connected to the driving unit 31.

An emitter of the switch 21 and one end of each of the resistors R1 and R2 are further individually connected to the source of the first semiconductor switch 20. A collector of the switch 21 and the other end of the resistor R1 are connected to the gate of the first semiconductor switch 20. In this manner, the switch 21 and the resistor R1 are connected between the source and the gate of the first semiconductor switch 20.

The other end of the resistor R2 is connected to the base of the switch 21 and one end of the third resistor R3. The other end of the resistor R3 is connected to the cathode of the diode D1. The anode of the diode D1 is connected to the conductor 12.

If the voltage at the gate of the first semiconductor switch 20 with respect to the potential of the source is at least an ON-threshold Vn1, then a resistance between the source and the drain is approximately zero $\Omega$. At this time, the first semiconductor switch 20 is switched on. Also, if the voltage at the gate of the first semiconductor switch 20 with respect to the potential of the source is less than an OFF-threshold Vf1, then the resistance between the source and the drain is sufficiently large so that hardly any current flows between the source and the drain. In this manner, if the voltage at the gate of the first semiconductor switch 20 with respect to the potential of the source is less than the OFF-threshold Vf1, the first semiconductor switch 20 is switched off. The OFF-threshold Vf1 is positive, and is less than the ON-threshold Vn1.

Similarly, if the voltage at the gate of the second semiconductor switch 30 with respect to the potential of the source is at least an ON-threshold Vn2, then the resistance between the source and the drain is approximately zero $\Omega$. At this time, the second semiconductor switch 30 is switched on. Also, if the voltage at the gate of the second semiconductor switch 30 with respect to the potential of the source is less than an OFF-threshold Vf2, then the resistance between the source and the drain is sufficiently large so that hardly any current flows between the source and the drain. In this manner, if the voltage at the gate of the second semiconductor switch 30 with respect to the potential of the source is less than the OFF-threshold Vf2, then the second semiconductor switch 30 is switched off. The OFF-threshold Vf2 is positive, and is less than the ON-threshold Vn2.

Furthermore, if the voltage at the base of the switch 21 with respect to a potential of the emitter is at least an ON-threshold Vn3, then the resistance between the emitter and a collector is approximately zero $\Omega$. At this time, the switch 21 is switched on. Also, if the voltage at the base of the switch 21 with respect to the potential of the emitter is less than an OFF-threshold Vf3, then the resistance between the emitter and the collector is sufficiently large so that hardly any current flows between the emitter and the collector. In this manner, if the voltage at the gate of the switch 21 with respect to the potential of the emitter is less than the OFF-threshold Vf3, then the switch 21 is switched off. The OFF-threshold Vf3 is positive, and is less than the ON-threshold Vn3.

If the battery 11 is connected normally, no current flows through the resistors R2 and R3 due to the effect of the diode D1. Thus, the voltage at the base of the switch 21 with respect to the potential of the emitter is approximately zero V and is less than the OFF-threshold Vf3. Thus, if the battery 11 is connected normally, the switch 21 is off.

If the battery 11 is connected incorrectly, in other words, if a negative voltage is applied to the source of the first semiconductor switch 20 with respect to the potential of the source of the second semiconductor switch 30 included in the control circuits B1, then a current flows from the negative electrode terminal T2 through the conductor 12, the diode D1, the resistors R3 and R2 to the positive electrode terminal T1 in this order. At this time, the voltage decreases at the resistor R2, and the voltage at the base of the switch 21 with respect to the potential of the emitter is at least the ON-threshold Vn3, and the switch 21 is switched on. If the switch 21 is on, the voltage at the gate of the first semiconductor switch 20 with respect to the potential of the source is approximately zero V, and the voltage is less than the OFF-threshold Vf1. At this time, the first semiconductor switch 20 is off.

Thus, if the battery 11 is connected incorrectly, the switch 21 is switched on, and the first semiconductor switch 20 is switched off. As described above, because the cathode of the parasitic diode Dp1 is connected to the drain of the first semiconductor switch 20, if the first semiconductor switch 20 is off, then no current flows from the drain to the source of the first semiconductor switch 20. Thus, if the battery 11 is connected incorrectly, no current flows to the load A1.

If the battery 11 is connected incorrectly in a state in which the first semiconductor switch 20 is off, no current flows from the negative electrode terminal T2 to the load A1 irrespective of whether or not the switch 21 is on. Also, even if the first semiconductor switch 20 and the second semiconductor switch 30 are on, when the battery 11 is connected incorrectly, the first semiconductor switch 20 is forcibly switched off, and thus current is reliably prevented from flowing to the load A1.

Hereinafter, the power supply control device 10 will be described for a state in which the battery 11 is connected normally. For simplifying the description, the width of the voltage drop of each of the parasitic diodes Dp1 and Dp2 and the diode D2 in the forward direction is regarded as being sufficiently small.

In the first semiconductor switch 20, current is supplied from the gate to the parasitic capacitances Cs1 and Cd1, and the voltage at the gate with respect to the potential of the source is increased to at least the ON-threshold Vn1. This switches on the first semiconductor switch 20.

Also, the voltage at the gate with respect to the potential of the source is reduced to less than the OFF-threshold Vf1 by discharging the parasitic capacitances Cs1 and Cd1. This switches off the first semiconductor switch 20.

In the second semiconductor switch 30, current is supplied from the gate to the parasitic capacitances Cs2 and Cd2, and the voltage at the gate with respect to the potential of the source is increased to at least the ON-threshold Vn2. This switches on the second semiconductor switch 30.

Also, the voltage at the gate with respect to the potential of the source is reduced to less than the OFF-threshold Vf2 by discharging the parasitic capacitances Cs2 and Cd2. This switches off the second semiconductor switch 30.

A driving signal for instructing driving of the load A1 and a stop signal for instructing stopping of driving the load A1 are input from the microcomputer 22 to the driving unit 31 of the control circuit B1.

If the driving signal is input, the driving unit 31 outputs a driving voltage that is higher than a voltage Vb that is output from the battery 11 via an internal resistance (not shown) to the gate of the second semiconductor switch 30 and the gate of the first semiconductor switch 20. The driving unit 31 outputs the driving voltage via the internal resistance and the diode D2 to the gate of the first semiconductor switch 20.

The driving unit 31 outputs the driving voltage, and thereby current is supplied from the gate of the second semiconductor switch 30 to the parasitic capacitances Cs2 and Cd2, and current is supplied from the gate of the first semiconductor switch 20 to the parasitic capacitances Cs1 and Cd1. This charges the parasitic capacitances Cs1, Cd1, Cs2, and Cd2, and the voltages at the gates of the first semiconductor switch 20 and the second semiconductor switch 30 with respect to the potentials of their sources increase.

The driving unit 31 outputs the driving voltage, and thereby, the voltage at the gate of the first semiconductor switch 20 with respect to the potential of the source is at least the ON-threshold Vn1, and the voltage at the gate of the second semiconductor switch 30 with respect to the potential of the source is at least the ON-threshold Vn2. This switches on the first semiconductor switch 20 and the second semiconductor switch 30.

If the second semiconductor switch 30 is on, current flows from the positive electrode terminal T1 to the source and the drain of the first semiconductor switch 20, and the drain and the source of the second semiconductor switch 30 in this order.

Thus, the source of the first semiconductor switch 20 and the drain of the second semiconductor switch 30 function as current input terminals, and the drain of the first semiconductor switch 20 and the source of the second semiconductor switch 30 function as current output terminals. The gates of the first semiconductor switch 20 and the second semiconductor switch 30 function as control terminals.

If the driving unit 31 receives a stop signal from the microcomputer 22, then the driving unit 31 connects the gate of the second semiconductor switch 30 to the conductor 12 via its internal resistance. Accordingly, current flows from the parasitic capacitances Cs2 and Cd2 to the driving unit 31, the parasitic capacitances Cs2 and Cd2 discharge, the voltage at the gate of the second semiconductor switch 30 is less than the OFF-threshold Vf2, and the second semiconductor switch 30 is switched off. If the second semiconductor switch 30 is switched off, then the supply of power to the load A1 stops, and the load A1 stops operating.

When discharging stops in a state in which the gate of the second semiconductor switch 30 is connected to the conductor 12, the voltage at the drain of the second semiconductor switch 30 approximately coincides with the voltage Vb that is output from the battery 11, and the voltages at the gate and the source of the second semiconductor switch 30 are approximately zero V.

If the microcomputer 22 outputs the stop signal to the driving unit 31, and the driving unit 31 connects the gate of the second semiconductor switch 30 to the conductor 12, the output of the voltage from the driving unit 31 to the gate of the first semiconductor switch 20 stops. Thus, current flows from one end of the parasitic capacitances Cs1 and Cd1 on the gate side of the first semiconductor switch 20 through the resistor R1, and the parasitic capacitances Cs1 and Cd1 of the first semiconductor switch 20 discharge. Accordingly, the voltage at the gate of the first semiconductor switch 20 with respect to the potential of the source is less than the OFF-threshold Vf1, and the first semiconductor switch 20 is switched off.

The microcomputer 22 controls the operation of the control circuit B1 by outputting the driving signal or the stop signal to the driving unit 31.

When the parasitic capacitances Cs1 and Cd1 stop discharging in a state in which the gate of the second semiconductor switch 30 is connected to the conductor 12 via the internal resistance of the driving unit 31, the voltages between both ends of the parasitic capacitances Cs1 and Cd1 are approximately zero V, and the power accumulated in the parasitic capacitances Cs1 and Cd1 is approximately zero W.

As described above, if the driving unit 31 outputs the driving voltage via its internal resistance and connects the gate of the second semiconductor switch 30 to the conductor 12 via its internal resistance, and thereby adjusts the voltage at the gate of the second semiconductor switch 30, and switches on and off the first semiconductor switch 20 and the second semiconductor switch 30. This controls the supply of power to the load A1 via the second semiconductor switch 30. The driving unit 31 functions as a switching unit.

In the power supply control device 10, the driving unit 31 switches on the first semiconductor switch 20 and the second semiconductor switch 30 from off, at a high speed.

A comparative power supply control device is a power supply control device in which the resistor R1 is not provided, and the gate of the first semiconductor switch 20 is connected to the gate of the second semiconductor switch 30 without passing through the diode D2. The driving unit 31 outputs the driving voltage, and thereby the comparative power supply control device is also capable of switching the first semiconductor switch 20 and the second semiconductor switch 30 from off to on.

As a matter of course, the driving units 31 in the power supply control device 10 and the comparative power supply control device supply the same power.

Figure 3:
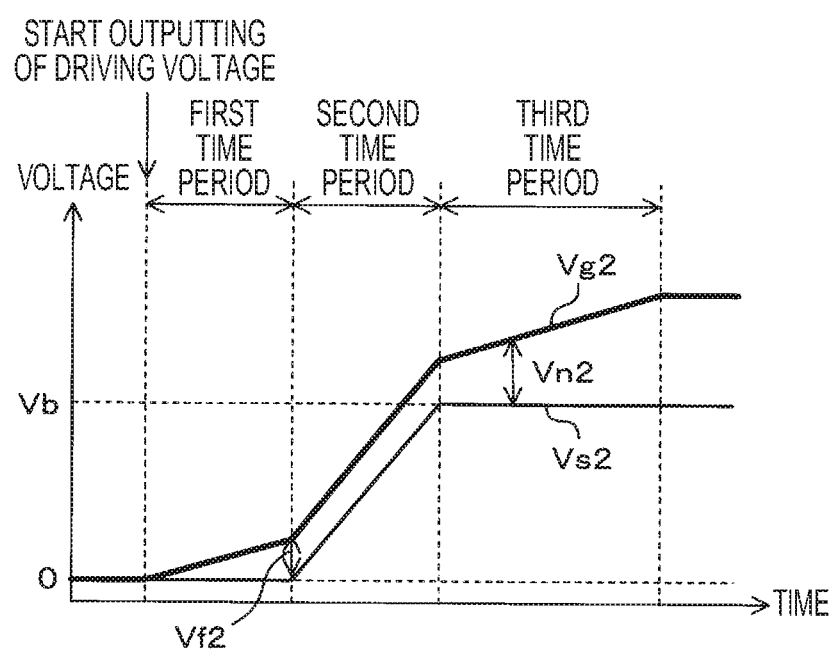
FIG. 3 is a timing chart for illustrating switching on a second semiconductor switch.

FIG. 3 is a timing chart for illustrating switching on the second semiconductor switch 30. FIG. 3 shows a change of a voltage Vs2 at the source and a change of a voltage Vg2 at the gate in the second semiconductor switch 30. Hereinafter, the voltage Vs2 at the source and the voltage Vg2 at the gate are respectively referred to as the source voltage Vs2 and the gate voltage Vg2. The source voltage Vs2 and the gate voltage Vg2 are each a voltage with respect to the potential of the conductor 12. The change of the gate voltage Vg2 and the change of the source voltage Vs2 are respectively indicated by thick and thin lines. A portion in which the change of the gate voltage Vg2 and the change of the source voltage Vs2 overlap each other is indicated by a thick line.

With regard to the power supply control device 10 and the comparative power supply control device, the direction of the change of the source voltage Vs2 and the direction of the change of the gate voltage Vg2 are not different from each other.

Hereinafter, a time period from when the driving unit 31 starts outputting the driving voltage to when the gate voltage Vg2 reaches the OFF-threshold Vf2 is called a first time period, and a time period from when the gate voltage reaches the OFF-threshold Vf2 to when the source voltage Vs2 reaches the voltage Vb output from the battery 11 is called a second time period. Furthermore, a time period from when the source voltage Vs2 reaches the voltage Vb output from the battery 11 to when the gate voltage Vg2 reaches the driving voltage is called a third time period. The first time period and the second time period in the power supply control device 10 are respectively shorter than the first time period and the second time period in the comparative power supply control device. The length of the third time period in the power supply control device 10 is approximately equal to the length of the third time period in the comparative power supply control device.

First, switching on in the comparative power supply control device will be described. In the comparative power supply control device, if the first semiconductor switch 20 and the second semiconductor switch 30 are off, current flows from the positive electrode terminal T1 through the parasitic capacitance Cs1 to the driving unit 31 in this order, and current flows from the positive electrode terminal T1 through the parasitic diode Dp1 and the parasitic capacitance Cd1 to the driving unit 31 in this order. Thus, the voltages at the source and the drain of the first semiconductor switch 20 with respect to the potential of the gate approximately coincide with the voltage Vb output from the battery 11. Therefore, the voltages at the gate of the first semiconductor switch 20 with respect to the potential of the source and the drain are negative.

In the first time period, the parasitic capacitances Cs1 and Cs2 are charged. Current is supplied from the gate of the first semiconductor switch 20 to the parasitic capacitance Cs1, and current is supplied from the gate of the second semiconductor switch 30 to the parasitic capacitance Cs2. The gate voltage Vg2 increases by charging the parasitic capacitance Cs2. The source voltage Vs2 is maintained at zero V until a difference between the gate voltage Vg2 and the source voltage Vs2 reaches the OFF-threshold Vf2.

If the difference between the gate voltage Vg2 and the source voltage Vs2 is the OFF-threshold Vf2, current flows between the drain and the source of the second semiconductor switch 30. At this time, because the first semiconductor switch 20 is off, current flows from the positive electrode terminal T1 through the parasitic diode Dp1 of the first semiconductor switch 20.

If current flows to the load A1, voltage is generated between both ends of the load A1, and the source voltage Vs2 increases. The voltage across both ends of the load A1 also increases together with an increase in the current flowing to the load A1. In the second time period, the parasitic capacitances Cs1, Cd1, and Cd2 are charged. The gate voltage Vg2 increases by charging the parasitic capacitance Cd2. Current is supplied from the gate of the first semiconductor switch 20 to the parasitic capacitances Cs1 and Cd1. Current is supplied from the gate of the second semiconductor switch 30 to the parasitic capacitances Cd2.

If the gate voltage Vg2 increases, current flowing to the load A1 increases, and the source voltage Vs2 increases. The source voltage Vs2 increases together with an increase in the gate voltage Vg2 until reaching the voltage Vb output from the battery 11 while the difference between the source voltage Vs2 and the gate voltage Vg2 is maintained at the OFF-threshold Vf2. After reaching the voltage Vb output from the battery 11, the source voltage Vs2 is maintained at the voltage Vb output from the battery 11.

In the third time period, the parasitic capacitances Cs1, Cd1, Cs2, and Cd2 are charged. By charging the parasitic capacitances Cs2 and Cd2, the gate voltage Vg2 increases up to the driving voltage in a state in which the source voltage Vs2 is maintained at the voltage Vb output from the battery 11. When the difference between the gate voltage Vg2 and the source voltage Vs2 is at least the ON-threshold Vn2, the second semiconductor switch 30 of the control circuit B1 is switched on.

The voltage at the gate of the first semiconductor switch 20 with respect to the potential of the conductor 12 changes in the same manner as the gate voltage Vg2, and the voltage at the source of the first semiconductor switch 20 with respect to the potential of the conductor 12 approximately coincides with the voltage Vb output from the battery 11. The voltage at the gate of the first semiconductor switch 20 with respect to the potential of the source increases from a negative voltage. If the voltage at the gate with respect to the potential of the source is at least the ON-threshold Vn1, then the first semiconductor switch 20 is switched on.

Next, switching on in the power supply control device 10 will be described. In the power supply control device 10, if the first semiconductor switch 20 and the second semiconductor switch 30 are off, the parasitic capacitance Cs1 discharges via the resistor R1, and the parasitic capacitance Cd1 discharges via the resistor R1 and the diode Dp1. Thus, the voltage at the gate of the first semiconductor switch 20 with respect to the voltage at the source and the voltage at the gate with respect to the voltage at the drain are approximately zero V. The voltage at the gate of the first semiconductor switch 20 with respect to the potential of the conductor 12 approximately coincides with the voltage Vb output from the battery 11.

In the first time period, no voltage is output from the driving unit 31 to the gate of the first semiconductor switch 20 from when the driving unit 31 starts outputting the driving voltage to when the gate voltage Vg2 of the second semiconductor switch 30 is at least the voltage Vb output from the battery 11.

In the first time period, the overall power supplied by the driving unit 31 is supplied to the parasitic capacitance Cs2, and only the parasitic capacitance Cs2 is charged. Current is supplied from the gate of the second semiconductor switch 30 to the parasitic capacitance Cs2. The gate voltage Vg2 increases by charging the parasitic capacitance Cs2. The source voltage Vs2 is maintained at zero V until the difference between the gate voltage Vg2 and the source voltage Vs2 reaches the OFF-threshold Vf2. The OFF-threshold Vf2 is less than the voltage Vb output from the battery 11.

If the difference between the gate voltage Vg2 and the source voltage Vs2 is the OFF-threshold Vf2, current flows between the drain and the source of the second semiconductor switch 30. At this time, because the first semiconductor switch 20 is off, current flows from the positive electrode terminal T1 through the parasitic diode Dp1 of the first semiconductor switch 20.

Note that in the first time period, the voltage at the drain of the first semiconductor switch 20 increases due to an increase in the gate voltage Vg2. On the other hand, the voltage at the gate of the first semiconductor switch 20 is maintained at the voltage Vb output from the battery 11. Thus, the parasitic capacitance Cd1 is charged. However, the electrostatic capacitance of the parasitic capacitance Cd1 is one tenth of the electrostatic capacitance of the parasitic capacitance Cs1, for example, and thus is sufficiently small so that power supplied to the parasitic capacitance Cd1 in the first time period is negligibly small.

If current flows to the load A1, a voltage is generated between both ends of the load A1, and the source voltage Vs2 increases. The voltage across both ends of the load A1 also increases together with an increase in the current flowing to the load A1. In the second time period, the parasitic capacitance Cd2 is charged, and the gate voltage Vg2 increases. Current is supplied from the gate of the second semiconductor switch 30 to the parasitic capacitance Cd2.

With the power supply control device 10, similarly to the comparative power supply control device, the source voltage Vs2 increases together with an increase in the gate voltage Vg2 until reaching the voltage Vb output from the battery 11 while the difference between the source voltage Vs2 and the gate voltage Vg2 is maintained at the OFF-threshold Vf2. After reaching the voltage Vb output from the battery 11, the source voltage Vs2 is maintained at the voltage Vb output from the battery 11.

In the third time period, similarly to the comparative power supply control device, the parasitic capacitances Cs1, Cd1, Cs2, and Cd2 are charged. By charging the parasitic capacitances Cs2 and Cd2, the gate voltage Vg2 increases up to the driving voltage in a state in which the source voltage Vs2 is maintained at the voltage Vb output from the battery 11. When the difference between the gate voltage Vg2 and the source voltage Vs2 is at least the ON-threshold Vn2, the second semiconductor switch 30 of the control circuit B1 is switched on.

The voltage at the gate of the first semiconductor switch 20 with respect to the potential of the conductor 12 is maintained at the voltage Vb output from the battery 11 while the gate voltage Vg2 is less than the voltage Vb output from the battery 11, and the voltage at the gate of the first semiconductor switch changes in the same manner as the gate voltage Vg2 after the gate voltage Vg2 is at least the voltage Vb output from the battery 11. The voltage at the source of the first semiconductor switch 20 with respect to the potential of the conductor 12 approximately coincides with the voltage Vb output from the battery 11. The voltage at the gate of the first semiconductor switch 20 with respect to the potential of the source increases from zero V. If the voltage at the gate with respect to the potential of the source is at least the ON-threshold Vn1, then the first semiconductor switch 20 is switched on.

As described above, with the comparative power supply control device, the driving unit 31 outputs the driving voltage, and thereby, the parasitic capacitances Cs1 and Cs2 are charged in the first time period, the parasitic capacitances Cs1, Cd1, and Cd2 are charged in the second time period, and the parasitic capacitances Cs1, Cd1, Cs2, and Cd2 are charged in the third time period. When the driving unit 31 outputs the driving voltage, the voltages at the gate of the first semiconductor switch 20 with respect to the potentials of the source and the drain are negative. Thus, the parasitic capacitance Cs1 is charged in the first time period, and the parasitic capacitances Cs1 and Cd1 are charged in the second time period.

On the other hand, with the power supply control device 10, the driving unit 31 outputs the driving voltage, and thereby, the parasitic capacitance Cs2 is charged in the first time period, the parasitic capacitance Cd2 is charged in the second time period, and the parasitic capacitances Cs1, Cd1, Cs2, and Cd2 are charged in the third time period. When the driving unit 31 outputs the driving voltage, the voltage at the gate of the second semiconductor switch 30 is less than the voltage Vb output from the battery 11. While the voltage at the gate of the second semiconductor switch 30 is less than the voltage Vb output from the battery 11, the voltage at the gate of the first semiconductor switch 20 is maintained at the output voltage Vb, and the voltages having the potentials of the source and the drain are zero V. Thus, it is not necessary to charge the parasitic capacitance Cs1 in the first time period, and it is not necessary to charge the parasitic capacitances Cs1 and Cd1 in the second time period.

Thus, with the power supply control device 10, it takes a short time from when the driving unit 31 outputs the driving voltage to when the first semiconductor switch 20 and the second semiconductor switch 30 are switched on. Thus, the power supply control device 10 has a small switching loss caused when the first semiconductor switch 20 and the second semiconductor switch 30 are switched on from off. Furthermore, it takes a short time for current to flow through the parasitic diode Dp1 of the first semiconductor switch 20, and power consumption is small.

Also, the power supply control device 10 has a fast speed at which the driving unit 31 switches off the first semiconductor switch 20 and the second semiconductor switch 30 from on.

With the comparative power supply control device, if the driving unit 31 connects the gate of the second semiconductor switch 30 to the conductor 12 via its internal resistance, current flows from the parasitic capacitances Cs1, Cd1, Cs2, and Cd2 to the driving unit 31, and the parasitic capacitances Cs1, Cd1, Cs2, and Cd2 discharge. As described above, if the voltage at the gate of the first semiconductor switch 20 with respect to the potential of the source is less than the OFF-threshold Vf1, the first semiconductor switch 20 is switched off. If the voltage at the gate of the second semiconductor switch 30 with respect to the potential of the source is less than the OFF-threshold Vf2, the second semiconductor switch 30 is switched off.

With the power supply control device 10, if the driving unit 31 connects the gate of the second semiconductor switch 30 to the conductor 12 via its internal resistance, current flows from the parasitic capacitances Cs2 and Cd2 to the driving unit 31, and the parasitic capacitances Cs2 and Cd2 discharge. The parasitic capacitances Cs1 and Cd1 discharge via the resistor R1. Thus, it takes a short time from when the driving unit 31 connects the second semiconductor switch 30 to the conductor 12 via its internal resistance to when the voltage at the gate of the second semiconductor switch 30 with respect to the potential of the source is less than the OFF-threshold Vf2. Thus, the power supply control device 10 has a small switching loss caused when the first semiconductor switch 20 and the second semiconductor switch 30 are switched off from on.

Also, the first semiconductor switch 20 and the second semiconductor switch 30 are switched on and off by the driving unit 31 adjusting the voltage at the gate of the second semiconductor switch 30, and thus the power supply control device 10 is manufactured at a low cost.

Embodiment 2

Figure 4:
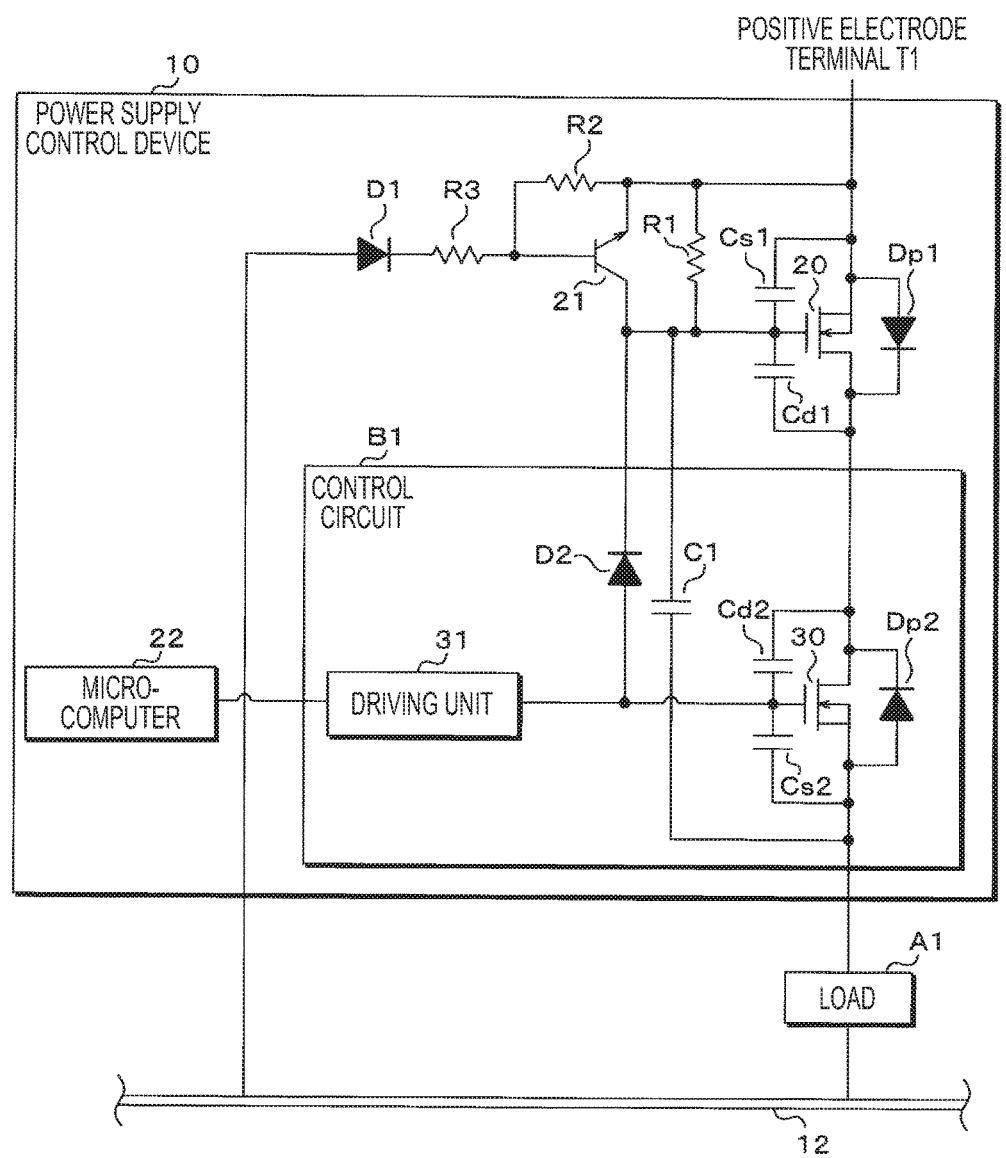
FIG. 4 is a circuit diagram of a power supply control device in Embodiment 2.

FIG. 4 is a circuit diagram of a power supply control device 10 in Embodiment 2.

Hereinafter, Embodiment 2 will be described in terms of differences from Embodiment 1. Configurations other than the later-described configurations are similar to those in Embodiment 1, and thus constituent portions that are similar to those in Embodiment 1 are given similar reference numerals, and their redundant description will be omitted.

In the power supply system 1 according to Embodiment 2, a power supply control device 10, a battery 11, a conductor 12, and a load A1 are connected in the same manner as in Embodiment 1.

If the power supply control device 10 in Embodiment 2 is compared with the power supply control device 10 in Embodiment 1, they are different in that a control circuit B1 further includes a capacitor C1. The capacitor C1 is connected between a gate of a first semiconductor switch 20 and the source of a second semiconductor switch 30. Thus, if a driving unit 31 outputs a driving voltage to the gate of the second semiconductor switch 30, the first semiconductor switch 20 is switched on from off more quickly. The following is a description of the power supply control device 10 in a state in which the battery 11 is connected normally.

Figure 5:
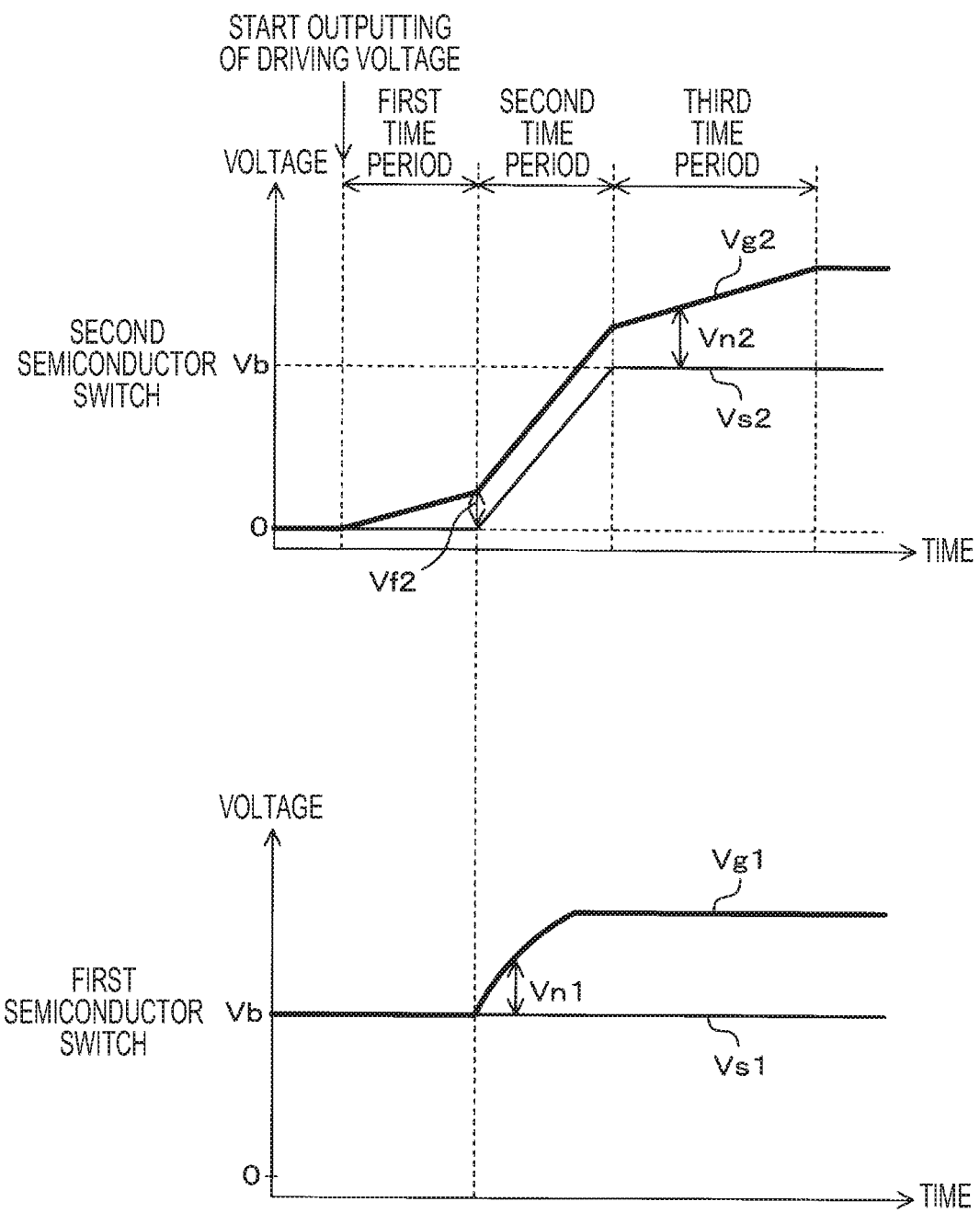
FIG. 5 is a timing chart for illustrating the effect of a capacitor.

FIG. 5 is a timing chart for illustrating the effect of the capacitor C1. Similarly to FIG. 3, FIG. 5 shows a gate voltage Vg2 and a source voltage Vs2 of the second semiconductor switch 30 using thick and thin lines. With the power supply control device 10 in Embodiment 2, if the driving unit 31 starts outputting the driving voltage, the gate voltage Vg2 and the source voltage Vs2 also individually change in the same manner as in Embodiment 1.

FIG. 5 further shows a change of a voltage Vs1 at the source and a change of a voltage Vg1 at the gate in the first semiconductor switch 20. Hereinafter, the voltage Vs1 at the source and the voltage Vg1 at the gate are respectively referred to as the source voltage Vs1 and the gate voltage Vg1. The source voltage Vs1 and the gate voltage Vg1 are each a voltage with respect to the potential of the conductor 12. The change of the gate voltage Vg1 and the change of the source voltage Vs1 are respectively indicated by thick and thin lines. A portion in which the change of the gate voltage Vg1 and the change of the source voltage Vs1 overlap each other is indicated by a thick line.

If the second semiconductor switch 30 is off, current flows from a positive electrode terminal T1 to a resistor R1 and the capacitor C1 in this order, and the capacitor C1 is charged. The capacitor C1 is charged until the voltage across both ends of the capacitor C1 approximately coincides with the voltage Vb output from the battery 11. When the driving unit 31 outputs the driving voltage, the voltage across both ends of the capacitor C1 approximately coincides with the voltage Vb output from the battery 11.

As shown in FIG. 5, if the gate voltage Vg2 is less than the voltage Vb output from the battery 11 and the source voltage Vs2 is approximately zero V, the gate voltage Vg1 and the source voltage Vs1 are individually maintained at the voltage Vb output from the battery 11.

As described in Embodiment 1, in a second time period, the source voltage Vs2, that is, a voltage at one end of the capacitor C1 on the load A1 side increases together with an increase in the gate voltage Vg2. At this time, because the voltage across both ends of the capacitor C1 approximately coincides with the voltage Vb output from the battery 11, the voltage at one end of the capacitor C1 on the resistor R1 side exceeds the voltage Vb output from the battery 11, current is supplied from the capacitor C1 to the parasitic capacitances Cd1 and Cs1 of the first semiconductor switch 20, and the parasitic capacitances Cd1 and Cs1 are charged. As a result, the gate voltage Vg2 is less than the voltage Vb output from the battery 11, but the gate voltage Vg1 increases together with an increase in the gate voltage Vg2.

The source voltage Vs1 of the first semiconductor switch 20 is maintained at the voltage Vb output from the battery 11. If a difference between the gate voltage Vg1 and the source voltage Vs1 is at least an ON-threshold Vn1, the first semiconductor switch 20 is switched on. Thereafter, the gate voltage Vg1 is maintained at the driving voltage output from the driving unit 31, and is stabilized.

As described above, a time period from when the driving unit 31 outputs the driving voltage to when the first semiconductor switch 20 is switched on is shorter in the power supply control device 10 in Embodiment 2. In this manner, because the first semiconductor switch 20 is switched on more quickly, with the first semiconductor switch 20, a time period in which current flows through a parasitic diode Dp1 is even shorter, and power consumed in the first semiconductor switch 20 is even smaller.

If the first semiconductor switch 20 and the second semiconductor switch 30 are on, the source voltage Vs2 of the second semiconductor switch 30 approximately coincides with the voltage Vb output from the battery 11, and the gate voltage Vg1 of the first semiconductor switch 20 approximately coincides with the driving voltage output from the driving unit 31.

Furthermore, because the capacitor C1 is connected between the gate of the first semiconductor switch 20 and the source of the second semiconductor switch 30, if the driving unit 31 connects the gate of the second semiconductor switch 30 to the conductor 12 via its internal resistance, the first semiconductor switch 20 is switched off from on more quickly.

If the driving unit 31 connects the gate of the second semiconductor switch 30 to the conductor 12 via its internal resistance, as described in Embodiment 1, the parasitic capacitances Cd2 and Cs2 discharge, and the gate voltage Vg2 of the second semiconductor switch 30 decreases. Accordingly, the resistance between the drain and the source of the second semiconductor switch 30 increases, current flowing to a load A1 decreases, and the source voltage Vg2 of the second semiconductor switch 30 decreases. A voltage at one end of the capacitor C1 on the resistor R1 side also decreases together with a decrease in the source voltage Vs2.

If the driving unit 31 connects the gate of the second semiconductor switch 30 to the conductor 12 via its internal resistance, the parasitic capacitances Cd1 and Cs1 discharge via the resistor R1 in the same manner as in Embodiment 1. Furthermore, with the power supply control device 10 in Embodiment 2, the voltage at one end of the capacitor C1 on the resistor R1 side decreases, and thus current also flows from the parasitic capacitances Cd1 and Cs1 to the capacitor C1. Accordingly, the parasitic capacitances Cd1 and Cs1 discharge, and the capacitor C1 is charged.

Therefore, the parasitic capacitances Cd1 and Cs1 discharge via the resistor R1 and charge the capacitor C1, and thus, the voltage at the gate of the first semiconductor switch 20 decreases more quickly, and the first semiconductor switch 20 is switched off from on more quickly.

The power supply control device 10 in Embodiment 2 has all of the constituent portions of the power supply control device 10 in Embodiment 1, and thus exhibits effects that are similar to those of the power supply control device 10 in Embodiment 1.

Embodiment 3

In Embodiment 2, the number of loads to which the power supply control device 10 controls the supply of power is one.

However, the number of loads to which the power supply control device 10 controls the supply of power may also be two or greater.

Hereinafter, Embodiment 3 will be described in terms of differences from Embodiment 2. Configurations other than the later-described configurations are similar to those in Embodiment 2, and thus constituent portions that are similar to those in Embodiment 2 are given similar reference numerals, and their redundant description will be omitted.

Figure 6:
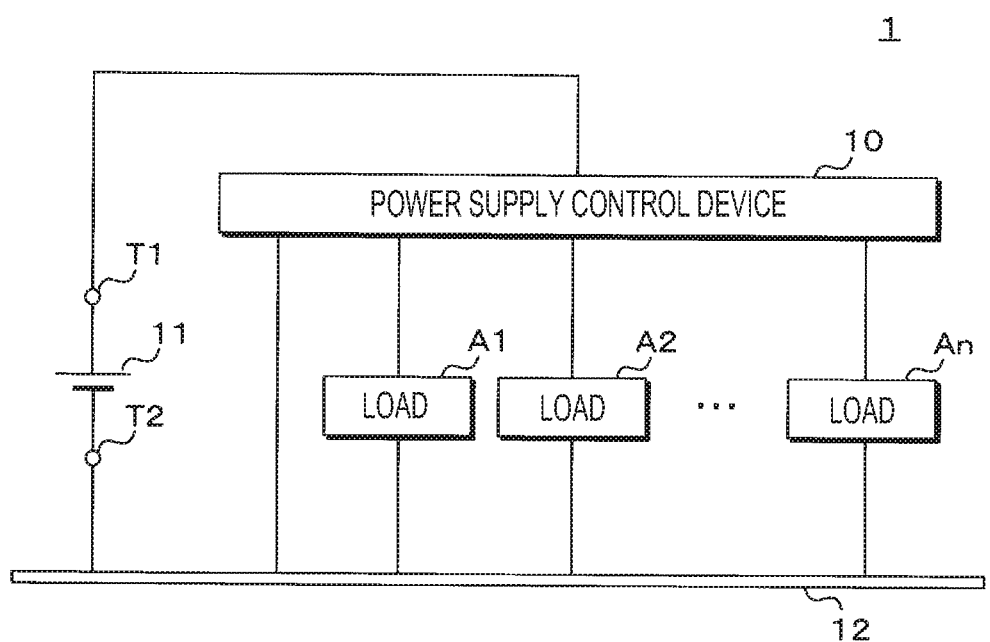
FIG. 6 is a block diagram showing the configuration of the main portions of a power supply system in Embodiment 3.

FIG. 6 is a block diagram showing the configuration of the main portions of a power supply system 1 in Embodiment 3. Similarly to Embodiment 2, a power supply system 1 in Embodiment 3 includes a power supply control device 10, a battery 11, a conductor 12, and a load A1. These are connected in the same manner as in Embodiment 2. The power supply system 1 in Embodiment 3 further includes (n−1) loads A2, A3, . . . , and An (where n represents an integer of at least two). One end of each of the loads A2, A3, . . . , and An is connected to the power supply control device 10, and the other end of each of the loads A2, A3, . . . , and An is connected to the conductor 12.

If the battery 11 is connected normally, then, power is separately supplied from the battery 11 via the power supply control device 10 to the n loads A1, A2, . . . , and An. The power supply control device 10 controls the supply of power from the battery 11 to the n loads A1, A2, . . . , and An. Similarly to the load A1, the loads A2, A3, . . . , and An are electric devices installed in the vehicle, and when power is supplied to these loads, these loads operate, and when power supply is stopped, these loads stop operating.

If the battery 11 is connected incorrectly, the power supply control device 10 prevents current from flowing from the negative electrode terminal T2 to the n loads A1, A2, . . . , and An.

Figure 7:
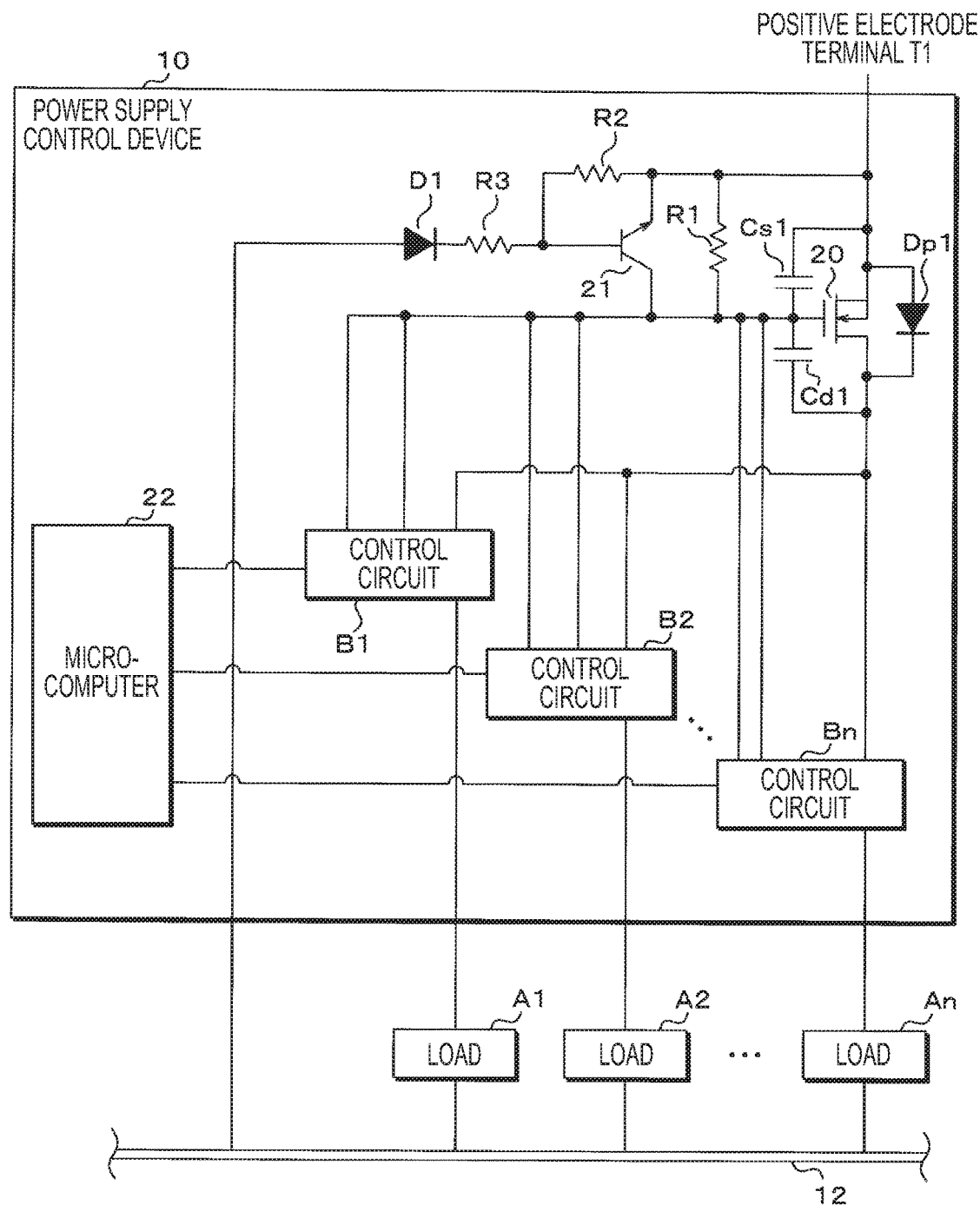
FIG. 7 is a circuit diagram of a power supply control device.

FIG. 7 is a circuit diagram of the power supply control device 10. Similarly to the power supply control device 10 in Embodiment 2, the power supply control device 10 in Embodiment 3 includes a first semiconductor switch 20, a switch 21, a microcomputer 22, a control circuit B1, parasitic capacitances Cd1 and Cs1, a parasitic diode Dp1, a diode D1, and resistors R1, R2, and R3. These are connected in the same manner as in Embodiment 2.

The power supply control device 10 in Embodiment 3 further includes (n−1) control circuits B2, B3, . . . , and Bn. The control circuits B2, B3, . . . , and Bn are individually connected to the gate and the drain of the first semiconductor switch 20 and the microcomputer 22. The control circuits B2, B3, . . . , and Bn are further connected to one end of each of the n loads A2, A3, . . . , and An.

Figure 8:
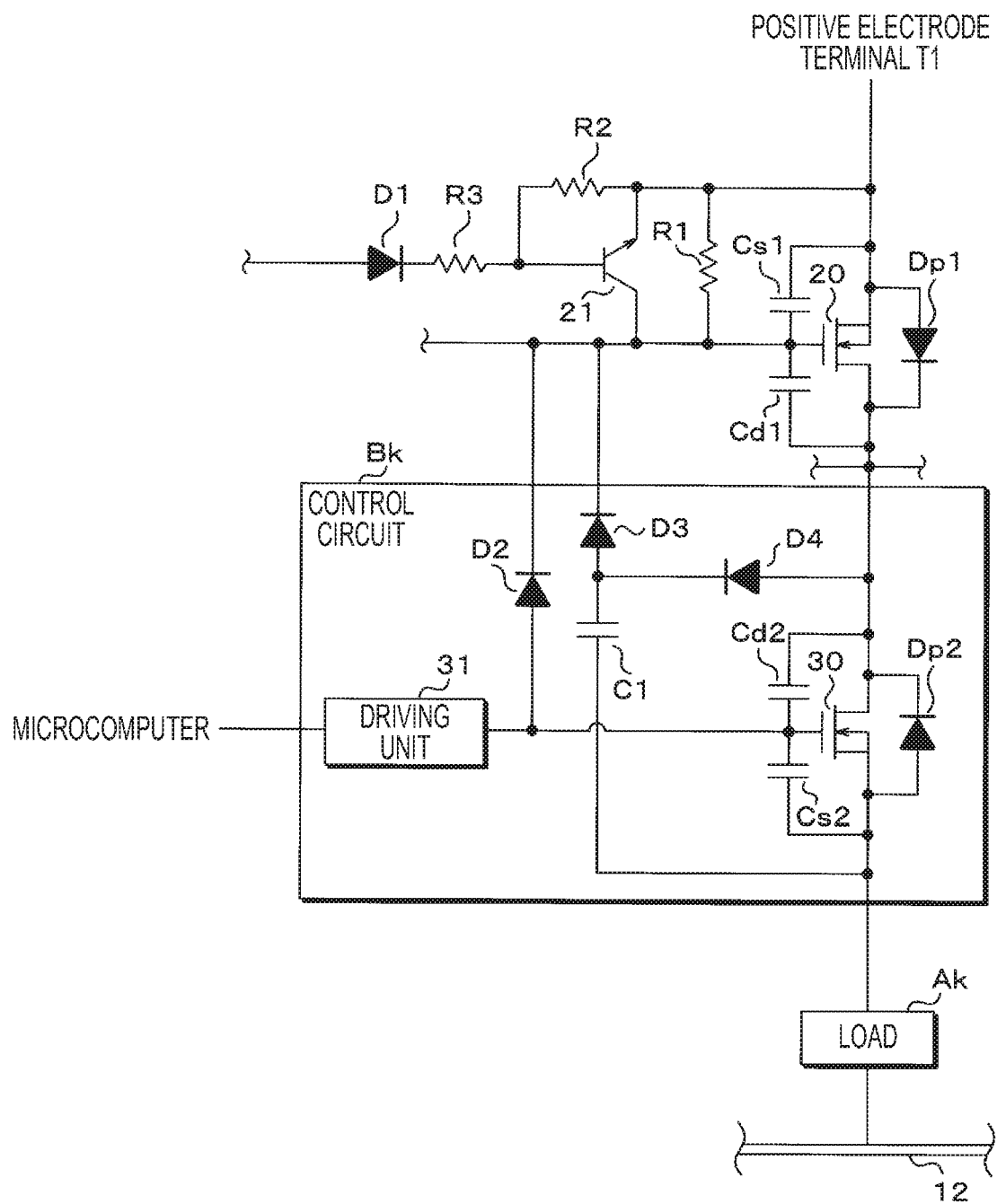
FIG. 8 is a circuit diagram of a control circuit.

FIG. 8 is a circuit diagram of a control circuit Bk (k=1, 2, . . . , and n). Similarly to the control circuit B1 in Embodiment 2, the control circuit Bk in Embodiment 3 includes the second semiconductor switch 30, the driving unit 31, the parasitic capacitances Cs2 and Cd2, the capacitor C1, the parasitic diode Dp2, and the diode D2.

The second semiconductor switch 30, the driving unit 31, the parasitic capacitances Cs2 and Cd2, the parasitic diode Dp2, and the diode D2 are connected in the same manner as in Embodiment 2, except for the connection of the source of the second semiconductor switch 30.

Thus, the drain of the second semiconductor switch 30 of the control circuit Bk is connected to the drain of the first semiconductor switch 20. Furthermore, the cathode of the diode D2 of the control circuit Bk is connected to the gate of the first semiconductor switch 20, and the anode of the diode D2 of the control circuit Bk is connected to the gate of the second semiconductor switch 30 of the control circuit Bk.

The source of the second semiconductor switch 30 of the control circuit Bk is connected to one end of the load Ak.

The control circuit Bk further includes diodes D3 and D4. In the control circuit Bk, the cathode of the diode D3 is connected to the gate of the first semiconductor switch 20. The anode of the diode D3 is connected to the cathode of the diode D4 and one end of the capacitor C1. The anode of the diode D4 is connected to the drain of the first semiconductor switch 20. The other end of the capacitor C1 is connected to the source of the second semiconductor switch 30. Similarly to the width of the voltage drop of each of the parasitic diodes Dp1 and Dp2 and the diode D2 in the forward direction, the width of the voltage drop of each of the diodes D3 and D4 in the forward direction is also regarded as being sufficiently small.

As described above, in Embodiment 3, the power supply control device 10 includes the n control circuits B1, B2, . . . , and Bn, and the control circuit Bk (k=1, 2, . . . , and n) includes the second semiconductor switch 30, the capacitor C1, and the diodes D2, D3, and D4. Thus, the number of second semiconductor switches 30, the number of capacitors C1, the number of diodes D2, the number of diodes D3, and the number of diodes D4 of the power supply control device 10 are each n and the same.

The diode D3 functions as a second diode, and the diode D4 functions as a third diode.

A driving signal for instructing driving of a load Ak and a stop signal for instructing stopping of driving the load Ak are input from the microcomputer 22 to the driving unit 31 of the control circuit Bk (k=1, 2, . . . , and n).

Similarly to the driving unit 31 in Embodiment 2, if the driving signal is input, the driving unit 31 of the control circuit Bk outputs a driving voltage to the gate of the second semiconductor switch 30 of the control circuit Bk and the gate of the first semiconductor switch 20 via its internal resistance (not shown). Accordingly, voltages at the gates of the first semiconductor switch 20 and the second semiconductor switch 30 of the control circuit Bk increase, and the first semiconductor switch 20 and the second semiconductor switch 30 of the control circuit Bk are switched on.

If the second semiconductor switch 30 of the control circuit Bk is on, current flows from the positive electrode terminal T1 to the source and the drain of the first semiconductor switch 20, and the drain and the source of the second semiconductor switch 30 of the control circuit Bk in this order. If the first semiconductor switch 20 and the second semiconductor switch 30 of the control circuit Bk are on, power is supplied to the load Ak, and the load Ak operates.

Similarly to the driving unit 31 in Embodiment 2, if the driving unit 31 of the control circuit Bk receives the stop signal, then the driving unit 31 connects the gate of the second semiconductor switch 30 of the control circuit Bk to the conductor 12 via its internal resistance. Accordingly, the parasitic capacitances Cs2 and Cd2 of the control circuit Bk discharge, the voltage at the gate of the second semiconductor switch 30 of the control circuit Bk is less than the OFF-threshold Vf2, and the second semiconductor switch 30 is switched off. Accordingly, the supply of power to the load Ak stops, and the load Ak stops operating.

The microcomputer 22 separately controls the operations of the n control circuits B1, B2, . . . , and Bn by outputting the driving signal or the stop signal to the driving units 31 of the n control circuits B1, B2, . . . , and Bn.

If the microcomputer 22 outputs the stop signal to the driving units 31 of the n control circuits B1, B2, . . . , and Bn, and the driving units 31 of the all of the n control circuits B1, B2, . . . , and Bn connect the gates of the second semiconductor switches 30 to the conductor 12, the output of the voltages to the gate of the first semiconductor switch 20 stops. In this case, the parasitic capacitances Cs1 and Cd1 discharge via the resistor R1. Accordingly, the voltage at the gate of the first semiconductor switch 20 with respect to the potential of the source is less than the OFF-threshold Vf1, and the first semiconductor switch 20 is switched off.

As described above, the driving units 31 of the n control circuits B1, B2, . . . , and Bn individually adjust the voltages at the gates of the n second semiconductor switches 30, and switch on and off the n second semiconductor switches 30. Accordingly, the supply of power to the loads A1, A2, . . . , and An via the n second semiconductor switches 30 is controlled. In Embodiment 3, the n driving units 31 function as switching units.

If at least one of the n driving units 31 outputs the driving voltage, that is, if at least one of the n second semiconductor switches 30 is switched on, the first semiconductor switch 20 is switched on. Also, if all of the n driving units 31 connect the gates of the second semiconductor switches 30 to the conductor 12 via its internal resistance, that is, if all of the n second semiconductor switches 30 are switched off, the first semiconductor switch 20 is switched off.

Furthermore, if the plurality of second semiconductor switches 30 are on, when one of the gates of the plurality of second semiconductor switches 30 that are on are connected to the conductor 12 via its internal resistance of the driving unit 31, no parasitic capacitances Cs1 and Cd1 discharge due to the effect of the diode D2. Thus, even if one of the driving units 31 connects the gate of the second semiconductor switch 30 to the conductor 12 via its internal resistance, only the second semiconductor switch 30 that is connected to the conductor 12 via its internal resistance is switched off as long as at least one of the other driving units 31 outputs the driving voltage.

If the driving unit 31 of the control circuit Bk outputs the driving voltage in a state in which the first semiconductor switch 20 and the n second semiconductor switches 30 are off, similarly to Embodiment 2, the first semiconductor switch 20 is switched on more quickly due to the effect of the capacitor C1.

If the second semiconductor switch 30 of the control circuit Bk is off, when the first semiconductor switch 20 is off, current flows from the positive electrode terminal T1 to the capacitor C1 via the parasitic diode Dp1 and the diode D4, and the capacitor C1 is charged. In a similar case, when the first semiconductor switch 20 is on, current flows from the positive electrode terminal T1 to the capacitor C1 via the first semiconductor switch 20 and the diode D4, and the capacitor C1 is charged. If the second semiconductor switch 30 of the control circuit Bk is off, the capacitor C1 is charged until the voltage across both ends of the capacitor C1 approximately coincides with the voltage Vb output from the battery 11 irrespective of whether or not the first semiconductor switch 20 is on.

The following is a description of the operations of the power supply control device 10 if the driving unit 31 of the control circuit Bk outputs the driving voltage in a state in which the first semiconductor switch 20 and the n second semiconductor switches 30 are off. If the voltage at the gate of the second semiconductor switch 30 is less than the voltage Vb output from the battery 11 and the voltage at the source of the second semiconductor switch 30 is approximately zero V, similarly to Embodiment 2, voltages at the gate and the source of the first semiconductor switch 20 are maintained at the voltage Vb output from the battery 11.

In the second time period in which the voltage at the source of the second semiconductor switch 30 increases together with an increase in the voltage at the gate of the second semiconductor switch 30, similarly to Embodiment 2, the voltage across both ends of the capacitor C1 approximately coincides with the voltage Vb output from the battery 11, and thus the voltage at one end of the capacitor C1 on the resistor R1 side exceeds the voltage Vb output from the battery 11. Accordingly, current is supplied from the capacitor C1 to the parasitic capacitances Cd1 and Cs1 of the first semiconductor switch 20 via the diode D3, and the parasitic capacitances Cd1 and Cs1 are charged. As a result, the gate voltage Vg2 is less than the voltage Vb output from the battery 11, but the gate voltage Vg1 increases together with an increase in the gate voltage Vg2.

The voltage at the source of the first semiconductor switch 20 is maintained at the voltage Vb output from the battery 11. If the difference between the gate voltage Vg1 and the source voltage Vs1 of the first semiconductor switch 20 is at least the ON-threshold Vn1, the first semiconductor switch 20 is switched on. Thereafter, the gate voltage Vg1 is maintained at the voltage Vb output from the battery 11 and is stabilized.

As described above, a time period from when the driving unit 31 outputs the driving voltage to when the first semiconductor switch 20 is switched on is shorter in the power supply control device 10 in Embodiment 3. In this manner, because the first semiconductor switch 20 is switched on more quickly, with the first semiconductor switch 20, a time period in which current flows through the parasitic diode Dp1 is even shorter, and power consumed in the first semiconductor switch 20 is even smaller.

In Embodiment 3, similarly to the diode D2, the diode D3 prevents the first semiconductor switch 20 from being switched off at the same time when one of the plurality of second semiconductor switches 30 that are on is switched off. In the control circuit Bk, if the driving unit 31 stops outputting the driving voltage and connects the gate of the second semiconductor switch 30 to the conductor 12 via its internal resistance, similarly to Embodiment 2, the parasitic capacitances Cs2 and Cd2 discharge, and the voltage at the gate of the second semiconductor switch 30 decreases. Accordingly, current flowing through the load Ak decreases, and thus the voltage at the source of the second semiconductor switch 30, that is, the voltage across both ends of the load Ak decreases.

If the voltage at the source of the second semiconductor switch 30 decreases, then the voltage at one end of the capacitor C1 on the resistor R1 side decreases. However, the control circuit Bk is provided with the diode D3, and thus no current flows from the parasitic capacitances Cs1 and Cd1 to the capacitor C1. Therefore, even if one of the n driving units 31 stops outputting the driving voltage and connects the gate of the second semiconductor switch 30 to the conductor 12 via its internal resistance, the first semiconductor switch 20 is kept on as long as at least one of the other driving units 31 outputs the driving voltage. Thus, if a plurality of the n loads A1, A2, . . . , and An operate, when the operation of one of the loads that are operating is stopped, no other load in operation unexpectedly stops operating.

In Embodiment 3, the power supply control device 10 includes the resistor R1, and the control circuit Bk (k=1, 2, . . . , and n) has the diode D2, and thus, similarly to Embodiments 1 and 2, the first semiconductor switch 20 and the second semiconductor switches 30 are switched on and off in a short time, and this power supply control device 10 has a small switching loss. Also, the n driving units 31 switch on and off the first semiconductor switch and the n second semiconductor switches 30 by individually adjusting the voltages at the gates of the n second semiconductor switches 30, and thus the power supply control device 10 can be manufactured at a low cost. Furthermore, if the battery 11 is connected incorrectly, the first semiconductor switch 20 is switched off, and thus current is reliably prevented from flowing from the negative electrode terminal T2 to then loads A1, A2, . . . , and An.

Note that in Embodiments 1 to 3, the switch 21 should be switched on from off if the battery 11 is connected incorrectly, and thus is not limited to an NPN bipolar transistor, and may also be a PNP bipolar transistor or an FET, for example.

Embodiments 1 to 3 that were disclosed are to be considered exemplary in all respects and in no way limiting. The scope of the present invention is defined by the scope of the appended claims and not by the above description, and all changes that fall within the same essential spirit as the scope of the claims are included therein.

REFERENCE SIGNS LIST

10 Power supply control device
20 First semiconductor switch
21 Switch
30 Second semiconductor switch
31 Driving unit (portion of switching unit)
C1 Capacitor
Dp1 Parasitic diode
D2 Diode
D3 Diode (second diode)
D4 Diode (third diode)
R1 Resistor

The invention claimed is:

1. A power supply control device configured with a switching unit configured to switch on and off a first semiconductor switch and a second semiconductor switch whose current input terminal is connected to a current output terminal of the first semiconductor switch, the power supply control device being configured to control supply of power via the second semiconductor switch by switching with the switching unit,
wherein the first semiconductor switch and the second semiconductor switch are switched on if a voltage at a control terminal is at least an ON-threshold, and the first semiconductor switch and the second semiconductor switch are switched off if the voltage at the control terminal is less than an OFF-threshold,
the power supply control device comprising:
a resistor that is connected between a current input terminal and the control terminal of the first semiconductor switch; and
a diode whose cathode is connected to the control terminal of the first semiconductor switch and whose anode is connected to the control terminal of the second semiconductor switch,
the switching unit performing switching by adjusting the voltage at the control terminal of the second semiconductor switch.

2. The power supply control device according to claim 1, comprising:
a parasitic diode whose cathode and anode are connected to the current output terminal and the current input terminal of the first semiconductor switch; and
a capacitor that is connected between the control terminal of the first semiconductor switch and the current output terminal of the second semiconductor switch.

3. The power supply control device according to claim 1, wherein a number of second semiconductor switches and a number of diodes are each at least two and are the same,
the current input terminals of a plurality of the second semiconductor switches are connected to the current output terminal of the first semiconductor switch,
cathodes of a plurality of the diodes are connected to the control terminal of the first semiconductor switch,
anodes of the plurality of diodes are respectively connected to the control terminals of the plurality of second semiconductor switches, and
the switching unit individually adjusts voltages at the control terminals of the plurality of second semiconductor switches.

4. The power supply control device according to claim 3, comprising:
a parasitic diode whose cathode and anode are connected to the current output terminal and the current input terminal of the first semiconductor switch;
a plurality of second diodes whose cathodes are connected to the control terminal of the first semiconductor switch;
a plurality of third diodes whose cathodes are respectively connected to anodes of the plurality of second diodes and whose anodes are connected to the current output terminal of the first semiconductor switch; and
a plurality of capacitors that each have one end connected to the anodes of the plurality of second diodes,
wherein the number of second diodes, the number of third diodes, and the number of capacitors are the same as the number of second semiconductor switches, and
other ends of the plurality of capacitors are respectively connected to the current output terminals of the plurality of second semiconductor switches.

5. The power supply control device according to claim 4, wherein the first semiconductor switch is switched on and off based on the voltage at the control terminal with respect to a potential of the current input terminal, and
the second semiconductor switch is switched on and off based on the voltage at the control terminal with respect to a potential of the current output terminal.

6. The power supply control device according to claim 5, comprising:
a switch that is connected between the current input terminal and the control terminal of the first semiconductor switch and that is switched on if a negative voltage is applied to the current input terminal of the first semiconductor switch with respect to the potential of the current output terminal of the plurality of second semiconductor switches,
wherein the first semiconductor switch is off if a voltage across the current input terminal and the control terminal is approximately zero V.

\* \* \* \* \*